(12) United States Patent
Kalte et al.

(10) Patent No.: US 12,341,512 B2
(45) Date of Patent: Jun. 24, 2025

(54) METHOD FOR PROGRAMMING AN FPGA

(71) Applicant: dSPACE GmbH, Paderborn (DE)

(72) Inventors: Heiko Kalte, Paderborn (DE); Dominik Lubeley, Paderborn (DE)

(73) Assignee: dSPACE GMBH, Paderborn (DE)

( * ) Notice: Subject to any disclaimer, the term of this patent is extended or adjusted under 35 U.S.C. 154(b) by 649 days.

(21) Appl. No.: 17/739,575

(22) Filed: May 9, 2022

(65) Prior Publication Data
US 2022/0360265 A1  Nov. 10, 2022

(30) Foreign Application Priority Data

May 10, 2021 (DE) .................... 10 2021 112 072.1
Jul. 8, 2021 (DE) .................... 10 2021 117 665.4

(51) Int. Cl.
*G06F 30/331* (2020.01)
*G06F 30/3312* (2020.01)
*H03K 19/17736* (2020.01)
*H03K 19/1776* (2020.01)
*H03K 19/17792* (2020.01)

(52) U.S. Cl.
CPC ... *H03K 19/17792* (2013.01); *H03K 19/1774* (2013.01); *H03K 19/17744* (2013.01); *H03K 19/1776* (2013.01)

(58) Field of Classification Search
CPC ......... H03K 19/17792; H03K 19/1774; H03K 19/17744; H03K 19/1776; G06F 30/331; G06F 30/3312; G06F 30/347
See application file for complete search history.

(56) References Cited

U.S. PATENT DOCUMENTS

| | | | |
|---|---|---|---|
| 6,086,629 A | | 7/2000 | McGettigan et al. |
| 2020/0057681 A1* | | 2/2020 | Mamaghani ........ G06F 11/3648 |
| 2023/0418324 A1* | | 12/2023 | Kalte .................. G06F 11/3051 |

OTHER PUBLICATIONS

Xing et al., "FPGA Adders: Performance Evaluation and Optimal Design," IEEE Design & Test Computers, vol. 15, No. 1, pp. 24-29 (1998).
Wong et al., "Self-characterization of Combinatorial Circuit Delays in FPGAs," Int'l Conf on Field-Programmable Tech, pp. 17-23 (2007).

\* cited by examiner

*Primary Examiner* — Nghia M Doan
(74) *Attorney, Agent, or Firm* — Muncy, Geissler, Olds & Lowe, P.C.

(57) ABSTRACT

A method for programming an FPGA, wherein a library, which includes elementary operations and a particular latency table for each of the elementary operations of the library is provided. Each latency table indicates the latency of the particular operation for a plurality of clock rates of the FPGA and for a plurality of input bit widths of the particular operation during the execution on the FPGA, depending on the input bit width of the particular operation and the clock rate of the FPGA. A data path indicating a consecutive execution of at least two elementary operations of the library on the FPGA is defined. The latencies given for the particular input bit width of the particular elementary operations of the data path for a plurality of different clock rates in the latency tables are detected and added, then one of the clock rates is selected.

10 Claims, 4 Drawing Sheets

METHOD FOR PROGRAMMING AN FPGA

This nonprovisional application claims priority under 35 U.S.C. § 119(a) to German Patent Application No. 10 2021 112 072.1, which was filed in Germany on May 10, 2021, and to German Patent Application No 10 2021 117 665.4, which was filed in Germany on Jul. 8, 2021, and which are herein incorporated by reference.

BACKGROUND OF THE INVENTION

Field of the Invention

The invention relates to a method for programming an FPGA (field programmable gate array).

Description of the Background Art

An FPGA is an integrated circuit in digital technology, to which a logic circuit may be loaded. In contrast to programming computers, microcontrollers and controllers, the term "programming" in terms of FPGAs means not only specifying time sequences but also defining the targeted circuit structure. This circuit structure is formulated with the aid of a hardware description language and then translated by software into a configuration file, which specifies how the elements in the FPGA are to be connected. In FPGA programming, a description of the hardware structure is thus generated, which is then transferred to the actual FPGA with the aid of synthesis and routing tools. This hardware description typically takes place in special languages, such as VHDL or Verilog. Instead of "FPGA programming," this is therefore also referred to as "FPGA configuration." In contrast to programming computers, microprocessors and controllers, the FPGA programming is thus not aimed at a predefined operating system and a driver basis. Instead, the FPGA programming is aimed at defining structures in the semiconductor, which carry out the intended functions later on. In this way, a degree of specialization and parallelism may be achieved, which is difficult to reach by conventional, prefabricated microprocessors.

The manual work involving hardware descriptions requires a great deal of experience on the part of the developer. This means that, as the complexity grows, the development and verification times also increase significantly. Alternatively to manual programming, more and more tools for FPGA programming have therefore become established, which automate the generation and verification of HDL code from a programming and development environment.

In the area of hardware-in-the-loop simulation (HiL simulation) and in rapid control prototyping systems (RCP systems), real-time simulations, for example in the technical fields of power electronics and electromobility, have long since no longer been covered by pure processor models. In many applications, such as simulations in which extremely fast control loops are needed, the latter must be supplemented or even replaced by FPGA models. Since these applications benefit greatly from very fast control loops, even FPGAs reach their limits here. Limiting factors are the maximum clock at which a model may be executed on an FPGA, and the number of clocks which an FPGA requires for a complete pass. With a typical clock of 100 MHz, i.e., a clock period of 10 ms, a controller of one hundred clocks in length reaches a cycle time of 1 µs. The number of required clock cycles results from the complexity of the calculation used. While simple logic operations may be passed through asynchronously, i.e. completely without clocks, an addition or multiplication of a number having a higher bit width requires multiple clock cycles. In contrast to a processor, the necessary number of clock cycles of an operation is always identical and is set during modeling on a one-time basis to the lowest value at which the model may still be implemented for the predefined clock for the FPGA hardware. In this way, it becomes clear that the number of necessary clock cycles for an operation, and thus also a signal path and an entire model, are dependent on the clock of the FPGA. If the clock is therefore simply increased for faster control loops, the quantities of the clock cycles within which individual operations run must also be increased as a countermeasure, so that the gain is frequently qualified by the higher clocking.

Therefore, to achieve the minimal throughput time for an FPGA model, the product of clock period and number of clock cycles must be minimized for all mathematical operations of the longest signal path. An optimization of the throughput time is, however, difficult in conventional systems, since the clock frequency, the latency and the bit width of a mathematical operation do not influence each other linearly. Moreover, further implementation technologies also exist, such as DSP blocks and lookup tables (LUTs), as well as different FPGA technologies, such as Xilinx Virtex, Kintex, etc., as well as FPGA degrees of speed.

The task of achieving a preferably short throughput time for an FPGA model has up to now been addressed by the experience of the particular developer: As a rule, a developer has already implemented similar operations with a similar bit width on the same FPGA type, so that the developer knows which clock frequencies and which latencies have led to good results in the different operations. Alternatively, a highly complex and manual design space exploration is carried out, in which the design is implemented in many different configurations, such as different clock frequencies and latencies of the individual operations. In essence, this design space exploration could be automated, which, however, is generally avoided, due to the enormous automation effort and great implementation times for creating the FPGA design. This ultimately results in the fact that the clock rates selected by the developer are often not an optimal solution, and it is also practically never clear how good the particular solution selected by the developer actually is. Design flows are an alternative to the procedure described above, in which the operations of a data path are input in an abstract high-level language, and the tool used for this purpose, such as Xilinx HLS, is able to independently define the latencies of the individual operations. But even here, the development must generally indicate a clock frequency, so that it is not ensured in this way that the minimal possible throughput time is actually achieved, resulting from the product of clock period and latency of the particular data path.

The abstract idea of measuring the delay of elementary operations of an FPGA to optimize the entire model using this information is known from the article "FPGA Adders: Performance Evaluation and Optimal Design" by Xing, S. and Yo, WWH in IEEE Design & Test of Computers, 1998, v. 15 n. 1, pages 24 to 29. In addition, the article "Self-Characterization of Combinatorial Circuit Delays in FPGAs" (Justin S. J. Wong, Pet Sedcole and Peter Y. K. Cheung, 2007 International Conference on Field-Programmable Technology, 2007, pp. 17-23) describes the search for the optimal clock rate for a given circuit. For this purpose, the clock rate is slowly increased until the circuit no longer functions, i.e., causes a so-called timing error. The highest possible clock rate is ascertained more precisely than the step width, using a statistic method. Finally, U.S. Pat. No. 6,086,629 A describes the creation of a database, in which delays for primitive cells are stored within so-called CLBs (configurable logic blocks) and a use of the database for timing during the routing of the FPGA.

SUMMARY OF THE INVENTION

It is therefore an object of the invention to provide a possibility for carrying out sequences on an FPGA at a clock rate that permits as short a throughput time as possible.

According to an exemplary embodiment of the invention, a method is thus provided for programming an FPGA, a library having elementary operations, executable on the FPGA, and a particular latency table for each of the elementary operations of the library being provided, each latency table indicating the latency of the particular operation for a plurality of clock rates of the FPGA and for a plurality of input bit widths of the particular operation during the execution on the FPGA, depending on the input bit width of the particular operation and the clock rate of the FPGA, the method comprising the following method steps: defining a data path, the data path indicating a consecutive execution of at least two elementary operations of the library on the FPGA; detecting the latencies given for the particular input bit width of the particular elementary operations of the data path for a plurality of different clock rates in the latency tables, and adding up these latencies for each clock rate, so that a total latency for the data path results in each case for this plurality of different clock rates; and selecting one of the clock rates from the plurality of different clock rates for operating the FPGA, depending on the absolute value of the particular total latency of the particular clock rates.

For each elementary operation executable on a particular FPGA, a particular latency table can be created in advance, from which the latency of the particular operation may be read out, depending on the clock rate and the bit width of the input data. Based on these tables, the latency of the signal path may then be easily ascertained in an FPGA model, depending on the clock rate, by adding up the individual latencies for each elementary operation of a signal path for the purpose of ascertaining an optimal clock rate for operating the signal path on an FPGA.

Depending on the model to be executed on the FPGA, it is possible, using relatively simple models, to assign each data path its own optimal clock rate, which results due to the lowest total latency. If it is demonstrated that different signal paths each have their lowest total latency at identical clock rates, these signal paths may be combined into a group, which is then operated at the same optimal clock rate.

It would, of course, be thus possible to create the latency tables as the first step during the course of programming the FPGA. However, it is preferably provided that the latency tables provided for the FPGA have been created in advance by means of measurements on an FPGA of the same type. If latency tables of this type are created ahead of time for a multiplicity or even for all of the existing FPGAs which are possible for a programming by a developer, these latency tables may be reused in each case during the programming of a corresponding FPGA. In other words, the one-time effort for creating these latency tables, which may indeed be quite high, takes place only once, and these latency tables be subsequently used for all programmings of a corresponding FPGA.

As addressed above, it is provided according to an example that, in the step of selecting one of the clock rates from the multiplicity of different clock rates for operating the FPGA, depending on the particular total latency of the particular clock rate, the clock rate is selected which is associated with the lowest total latency. Likewise, it is, of course, also within the scope of the invention to select a clock rate of this type for a data path, which is good but not the best, namely if signal paths are to be combined into a group, for which a single shared clock rate is to be used.

The method additionally can include the following method steps: defining at least one further data path, which indicates a different consecutive execution of at least two elementary operations of the library; adding up the latencies given by the particular input bit width of the particular elementary operations of the further data path for the same clock rates as for the other data path, so that a total latency for the further data path also results in each case for these clock rates; and selecting a clock rate from the plurality of clock rates for operating the FPGA, depending on the particular total latencies of the data path and the further data path.

This example of the invention is naturally not limited to a single further data path, but instead may comprise an arbitrary number of further data paths, for which a particular total latency is ascertained in the same way for each data rate. If all these data paths are operated at a shared clock rate, it is naturally not possible to select the optimal clock rate for each data path, but instead the clock rate selected for operating the group of data paths is a compromise.

If a program-logical connection exists between the data paths of the group, the data paths thus belong to a single program logic and are provided for shared processing of a data processing task, it is sensible to compare the total latencies of the data paths in the group with each other, to ascertain the highest total latency for each clock rate and to select a clock rate from the plurality of clock rates for operating the FPGA, which is associated with the total latency having the smallest absolute value among the ascertained highest total latencies.

It is thus provided that the FPGA as a whole can be operated at a single clock rate, the data path having the highest total latency for a particular clock rate being checked for each clock rate. If the FPGA were to be operated at this clock rate, this highest total latency would have to be used for all data paths so that the slowest data path, i.e., the data path having the highest total latency, may be completely passed through within the scope of the corresponding clock rate. This data path having the highest total latency determines the speed of processing on the FPGA, since all other data paths must "wait" for this slowest data path. If the total latency having the smallest absolute value among the highest total latencies is now selected from among the highest total latencies, which, of course, determine the processing speed on the FPGA at a particular clock rate, the clock rate is thus selected, at which the processing of the considered data path is the fastest overall.

As already addressed above, it is possible to combine data paths into a group, which is then operated at a single shared clock rate. By dividing the FPGA into logical clock domains, multiple groups may be formed, a clock rate for operating the group on the FPGA being ascertained according to the invention for each individual group, and each group being operated at the clock rate ascertained for the particular group. To keep the number of transitions between clock domains within reasonable limits, it is sensible to select the number of groups with care. The combining into groups of this type is possible, in principle, due to the fact that a check is made as to which clock rate is the optimal one for the individual data paths. If two data paths have the lowest total latency at an identical or similar clock rate, they may be combined into a corresponding group. As also addressed above, it is, of course, also possible to not select the optimal clock rate for a data path, i.e., the one which is actually associated with the lowest total latency, but rather a clock rate, which is associated with a good but no longer the optimal processing speed. According to one preferred refinement of the invention, it is now provided that the method includes the following method steps, in particular when combining data paths, for which it has not yet been established that they have an identical optimal clock rate: defining a plurality of further data paths, which each indicate a different consecutive execution of at least two elementary operations of the library, and forming a plurality of data path groups by combining at least two data paths in each case from the defined data paths; for each data path group, adding up the latencies for the same clock rates given by the particular input bit width of the particular elementary operations of one of each data path, so that a total latency results for these clock rates for each data path of the data path group; for all data path groups, selecting a clock rate for operating the particular data path group on the FPGA, depending on the particular total latencies of all data paths in the particular data path group.

As described above, in particular, the clock rate may be selected, which is associated with the total latency of the particular data path group having the smallest absolute value among the ascertained highest total latencies of the particular data path group.

It is possible to provide the latency tables for different types of elementary operations executable on the FPGA. According to one preferred refinement of the invention, however, it is provided that these latency tables are provided for such elementary operations executable on the FPGA which may not be further divided. These are, for example, operations such as an addition, a multiplication or a comparison of values. This procedure has the advantage that the total latency may in fact be ascertained for each possible data path, since a piece of information about the latency at a particular clock rate is present for each possible smallest unit of a data path of this type.

In principle, the invention is, of course, independent on the specific implementation of the library including the elementary operations. According to one preferred refinement of the invention, however, it is provided that the elementary operations of the library are elementary blocks from a block library of a programming environment, which is designed to create a program logic in the form of a flowchart constructed from elementary blocks. Examples of programming environments of this type are Simulink from The MathWorks Company LLC, and LabView from NI.

Finally, the invention also relates to a nonvolatile, computer-readable memory medium including commands stored thereon, which, when executed on a processor, effectuate a method as described above.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
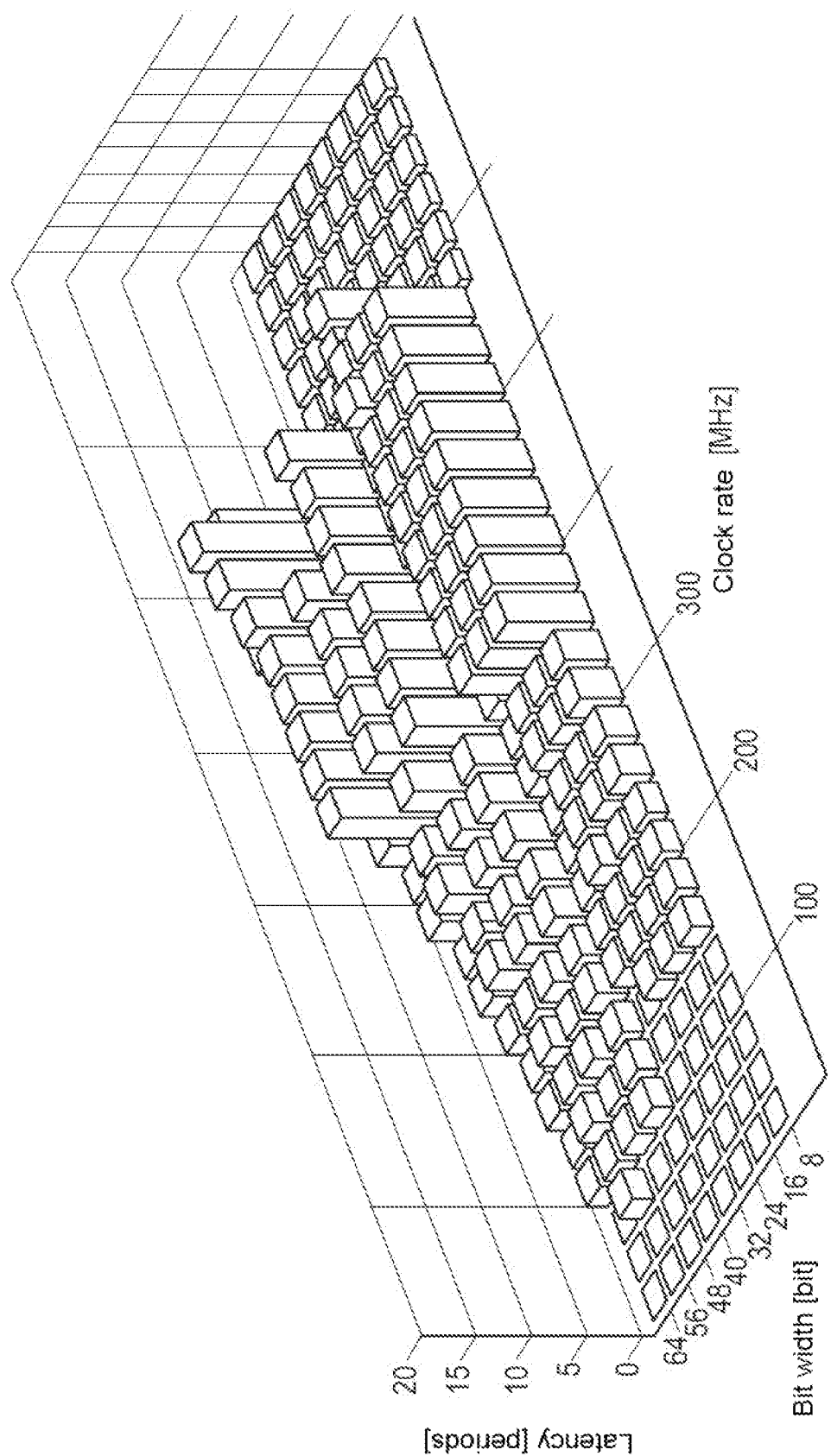
FIG. 1 shows a plotting of the latency of a multiplication operation on an FPGA of a particular type depending on the clock rate of the FPGA and the bit width of the operation, the latency being indicated in clock periods.

As explained above, the invention proposes that, for each elementary operation executable on a particular FPGA, a particular latency table is created in advance, from which the latency of the particular operation may be read out, depending on the clock rate and the bit width of the input data. Based on these tables, the latency of the signal path may then be easily ascertained in an FPGA model, depending on the clock rate by adding up the individual latencies for each elementary operation of a signal path. For this purpose, FIG. 1 shows a plotting of the latency of a multiplication operation on a particular FPGA, depending on the clock rate of the FPGA and the bit width of the operation. In FIG. 1, the latency is indicated in periods, i.e. clock cycles. The figure thus shows how many periods are necessary with a pre-defined bit width of the operation and a particular clock rate for operating the FPGA for a complete processing of the operation.

Figure 2:
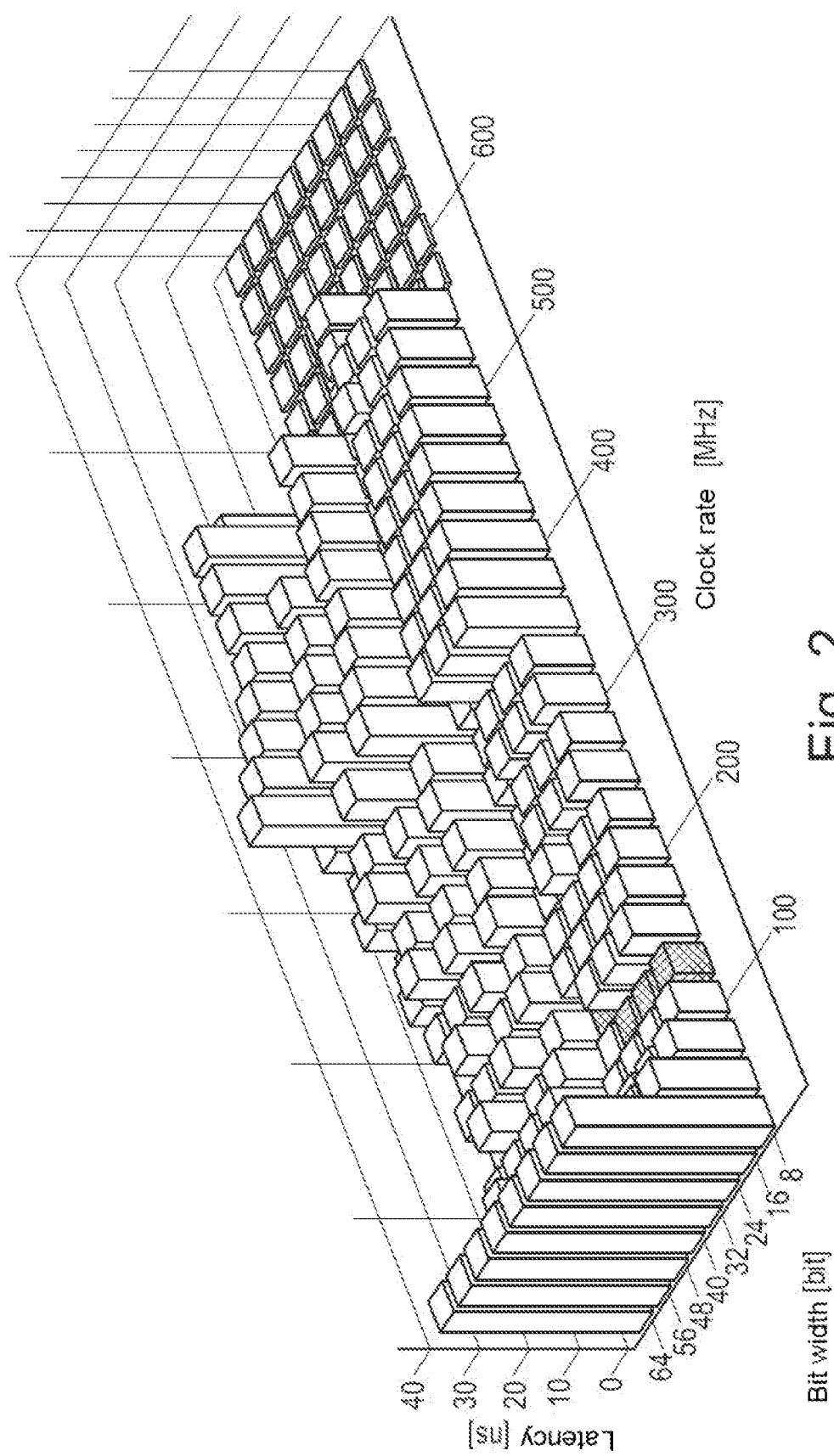
FIG. 2 shows a plotting of the latency of a multiplication operation on an FPGA of a particular type depending on the clock rate of the FPGA and the bit width of the operation, the latency being indicated in nanoseconds (ns)

It is now of interest to ascertain the clock rate for which a preferably fast processing of an elementary operation results at a given bit width; the product of the clock frequency and the number of periods necessary for a complete processing is thus definitive. The same is illustrated in FIG. 2, which shows a plotting of the latency of the same multiplication operation as in FIG. 1, depending on the clock rate of the FPGA and the bit width of the operation, the latency now being indicated in nanoseconds (ns) in FIG. 2. For the bit widths of 8 bits, 16 bits, 24 bits and 32 bits, the clock rate at which the lowest latency results is illustrated in each case as cross-hatched boxes in FIG. 2. It is apparent that this lowest latency is approximately 10 ns in a range of slightly above 100 MHz. As is apparent from FIG. 2, a significantly longer latency results for higher clock rates of up to more than 500 MHz, so that a relatively low clock rate supplies the best results here.

The latencies, indicated once in number of periods and once in time (ns), for the complete processing of the operation, depending on the bit width and the clock rate, are illustrated as three-dimensional bar graphs in FIGS. 1 and 2. However, this type of representation is used in the present case exclusively for the purpose of clarity. To provide a particular latency table for the elementary operations of the provided library, which are executable on the FPGA, in order to carry out a method according to the invention, it is, however, advantageous to provide these data in the form of a numeric table, in which a latency is assigned to each pair consisting of a bit width and a clock rate in the form of a time variable, e.g., in nanoseconds. A table of this type may be stored, for example, as a lookup table, which may be accessed digitally when carrying out a method according to the invention. In principle, a table of this type may look like the following, only latencies for clock rates of 60 to 140 MHz and 8 to 40 bits being indicated here as examples.

|  | 60 Mhz | 80 MHz | 100 MHz | 120 MHz | 140 MHz | ... |
|---|---|---|---|---|---|---|
| 8 bits | 40 ns | 21 ns | 18 ns | 10 ns | 14 ns | ... |
| 16 bits | 40 ns | 21 ns | 19 ns | 10 ns | 15 ns | ... |
| 24 bits | 40 ns | 32 ns | 22 ns | 12 ns | 18 ns | ... |
| 32 bits | 40 ns | 35 ns | 23 ns | 13 ns | 19 ns | ... |
| 40 bits | 40 ns | 36 ns | 25 ns | 15 ns | 21 ns | ... |
| ... | ... | ... | ... | ... | ... | ... |

Figure 3:
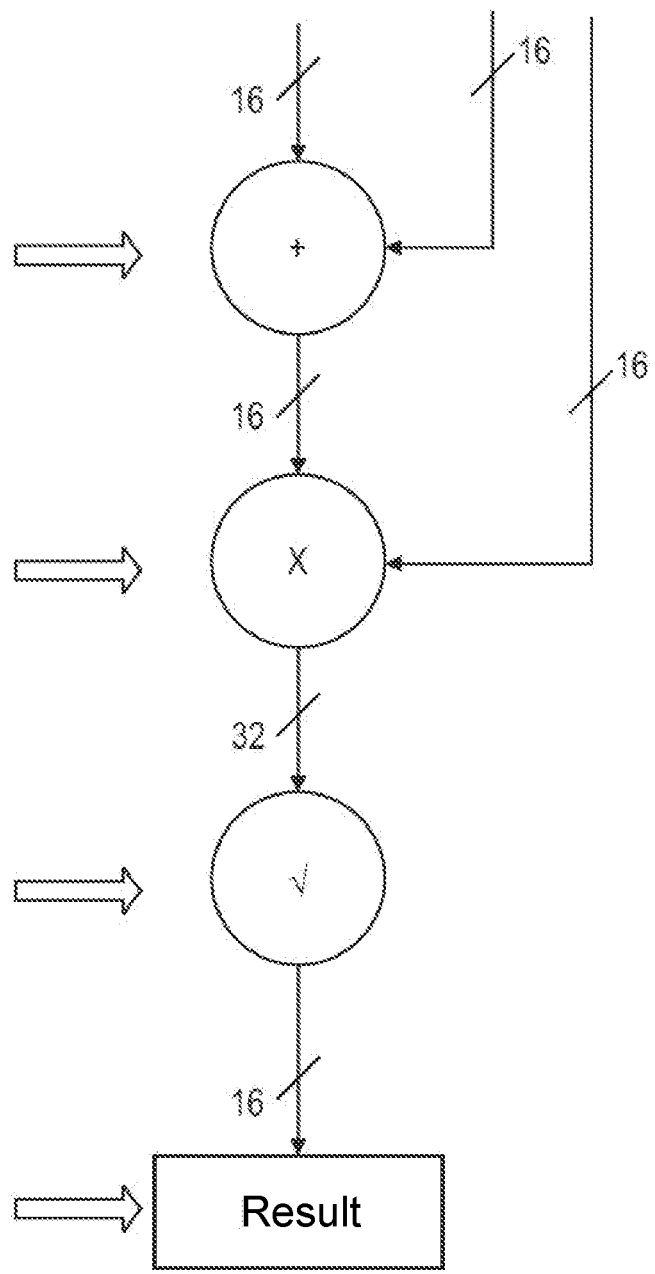
FIG. 3 schematically shows a data path made up of an addition, a multiplication and a root function.

These clock rates correspond to another operation not underlying FIGS. 1 and 2. It should furthermore be noted that tables are always provided, which are created for discrete clock rates, spaced apart at intervals of 20 MHz in the above table. In this regard, it is, of course, also possible to provide finer increments for the clock rate, which increases the effort involved in creating the latency tables, but then more accurately permits the ascertainment of the clock rate, which facilitates the fastest processing in the FPGA for an elementary operation or a particular data path.

Where the ascertainment of the total latency for a data path is now concerned, which is made up of a plurality of elementary operations, reference is made to FIG. 3. This figure schematically shows that the data path observed in the present case, which is made up of an addition having an input bit width of 16 bits, a multiplication having an input bit width of 16 bits, and an output bit width of 32 bits and a root function having an input bit width of 32 bits and an output bit width of 16 bits. If the total latency is now to be determined for this data path illustrated in FIG. 3, the latencies indicated (in ns) for the three functions of addition, multiplication and root function in the particular associated latency table are added up for all clock frequencies and with the particular input bit width of the corresponding operation.

Figure 4:
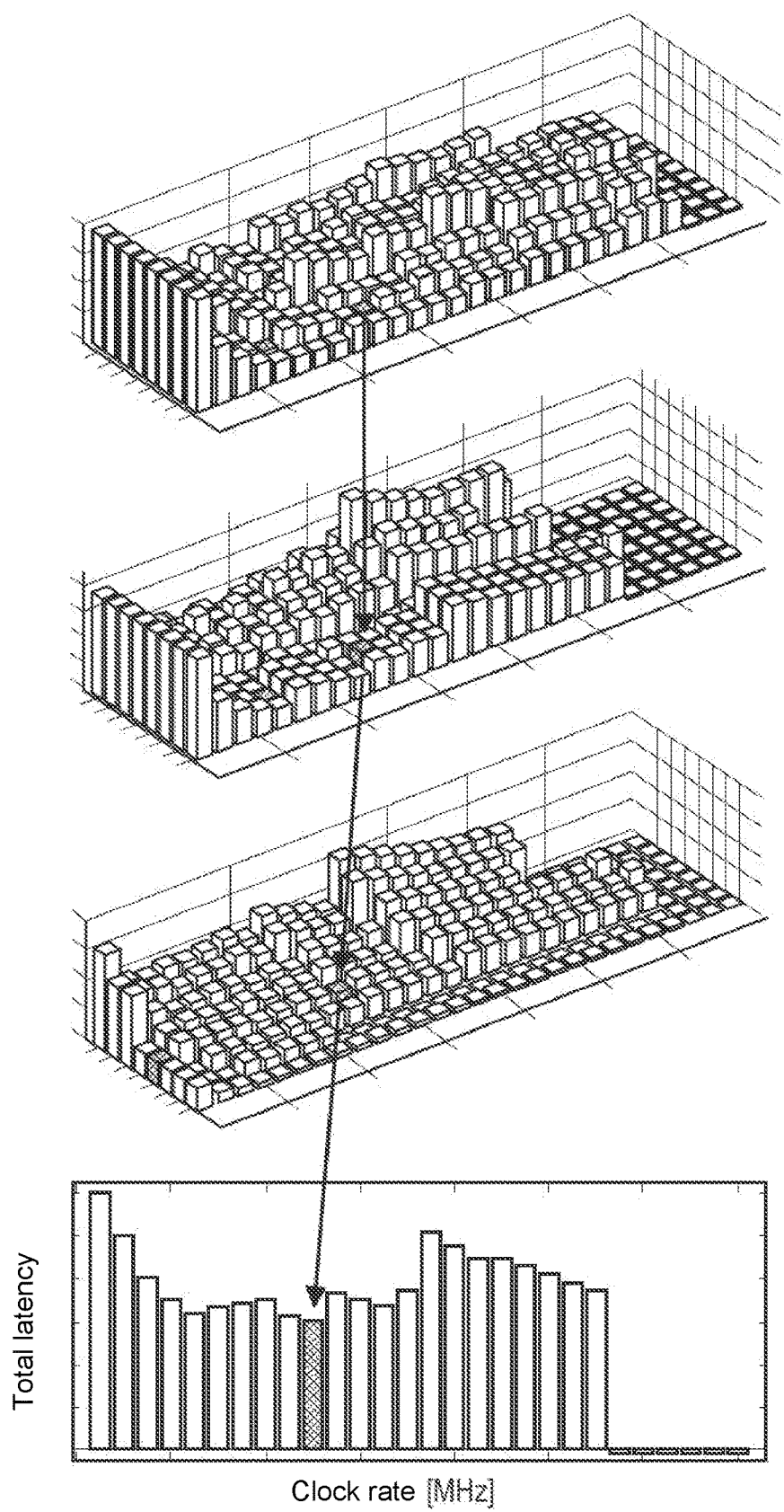
FIG. 4 schematically shows the ascertainment of the total latency of the data path from FIG. 3.

This is illustrated schematically in FIG. 4, in which the axis designations have been omitted in the three-dimensional bar graphs for the sake of clarity. For a particular clock rate, the arrows indicate by way of example that the latency for 16 bits must first be added up for the addition, followed by the corresponding latency for 16 bits for the multiplication and finally the latency of 32 bits for the root function. The bar graph at the very bottom of FIG. 4, which represents the total latency, i.e., the sums of the latencies of the addition, the multiplication and the root function, depending on the particular clock rate, thus results for all clock rates. It is apparent that the addition path represented by arrows as an example is associated, in particular, with the clock rate which supplies the lowest total latency overall. The fact that, in each case, the lowest latency for the three different elementary operations is at entirely different and significantly lower clock rates is thus worth noting (illustrated as cross-hatched boxes in FIG. 4). Due to the procedure described here, combining these three elementary operations, however, yields an entirely different clock rate, which supplies the best result in the present case for operating the FPGA.

In this way, an optimal clock rate, which corresponds to the clock rate having the lowest total latency, may be ascertained for each data path to be used for operating the FPGA. Data path groups may be formed in this way, which are operated in each case at a particular fixed clock rate. In one refinement of the invention, data paths are added to the data path groups, as already explained above, which, at the corresponding clock rate, are either processed on the FPGA with the shortest total latency or are processed not with the shortest total latency, but still with a very low total latency.

Moreover, for each data path group having a certain number of data paths, the optimal clock rate for operating their data paths on the FPGA may be determined as follows: The total latency is first ascertained for each clock rate for each data path. The total latencies of the data paths for a particular clock rate are then compared with each other for all clock rates, and the total latency which is the highest for this clock rate is ascertained for each clock rate. The data path having this clock rate limits the processing speed, since all other data paths at this clock rate must "wait" for this data path. Finally, the clock rate for operating the FPGA may be selected which is associated with the total latency of the particular data path group, which has the smallest absolute value among the ascertained highest total latencies. The clock rate at which the highest latency of the insofar "slowest" data path is the lowest is thus checked. At this clock rate, the other "faster" data paths must wait the least amount of time for the "slowest" data path. This method is carried out individually for different data path groups, so that the data paths of each data path group may be executed in each case at an optimal clock rate for the particular data path group.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for programming an FPGA, wherein a library, which includes elementary operations, executable on the FPGA, and a particular latency table for each of the elementary operations of the library is provided, each latency table indicating the latency of the particular operation for a plurality of clock rates of the FPGA and for a plurality of input bit widths of the particular operation during the execution on the FPGA, depending on the input bit width of the particular operation and the clock rate of the FPGA, the method comprising:
    defining a data path, the data path indicating a consecutive execution of at least two elementary operations of the library on the FPGA;
    detecting the latencies given for the particular input bit width of the particular elementary operations of the data path for a plurality of different clock rates in the latency tables, and adding up the detected latencies for each clock rate, so that a total latency for the data path results in each case for this plurality of different clock rates; and
    selecting one of the clock rates from the plurality of different clock rates for operating the FPGA, depending on the particular total latency of the particular clock rates.

2. The method according to claim 1, wherein the latency tables provided for the FPGA have been created in advance by means of measurements on an FPGA of the same type.

3. The method according to claim 1, wherein, in the step of selecting one of the clock rates from the multiplicity of different clock rates for operating the FPGA, depending on the particular total latency of the particular clock rate, the clock rate is selected which is associated with the lowest total latency.

4. The method according to claim 1, further comprising:
defining at least one further data path, which indicates a different consecutive execution of at least two elementary operations of the library;
adding up the latencies given by the particular input bit width of the particular elementary operations of the further data path for the same clock rates as for the other data path, so that a total latency for the further data path also results in each case for these clock rates; and
selecting a clock rate from the plurality of clock rates for operating the FPGA, depending on the particular total latencies of the data path and the further data path.

5. The method according to claim 4, further comprising:
comparing, for all clock rates, the total latencies of the data paths for the articular clock rate with each other, and ascertaining the highest total latency for the particular clock rate; and
selecting a clock rate from the plurality of clock rates for operating the FPGA, which is associated with the total latency having the smallest absolute value among the ascertained highest total latencies.

6. The method according to claim 1, further comprising:
defining a plurality of further different data paths, which each indicate a different consecutive execution of at least two elementary operations of the library, and forming a plurality of data path groups by combining at least two data paths in each case from the defined data paths;
adding up the latencies for the same clock rates given by the particular input bit width of the particular elementary operations of each data path for each data path group, so that a total latency results for these clock rates for each data path of the data path group; and
selecting a clock rate for operating the particular data path group on the FPGA for all data path groups, depending on the particular total latencies of all data paths in the particular data path group.

7. The method according to claim 6, wherein the clock rate is selectable which is associated with the total latency of the particular data path group which has the smallest absolute value among the ascertained highest total latencies of the particular data path group.

8. The method according to claim 1, wherein the elementary operations of the library are not further dividable.

9. The method according to claim 1, wherein the elementary operations of the library are elementary blocks from a block library of a programming environment, which is designed to create a program logic in the form of a flowchart constructed from elementary blocks.

10. A non-transitory computer-readable memory medium, having commands stored thereon, which, when executed on a processor, perform the method according to claim 1.

* * * * *